(12) United States Patent
Jia et al.

(10) Patent No.: US 12,705,170 B2
(45) Date of Patent: Aug. 11, 2026

(54) MULTI-PHASE METHOD FOR OPERATING A MEMORY WITH ERASE VERIFICATION, MEMORY AND, MEMORY SYSTEM

(71) Applicant: YANGTZE MEMORY TECHNOLOGIES CO., LTD., Wuhan (CN)

(72) Inventors: Jianquan Jia, Wuhan (CN); XiangNan Zhao, Wuhan (CN); Yuanyuan Min, Wuhan (CN); Ying Cui, Wuhan (CN); Kaikai You, Wuhan (CN); Chenhui Li, Wuhan (CN); Wei Qi, Wuhan (CN); Jiameng Cui, Wuhan (CN); Lei Guan, Wuhan (CN); Junbao Wang, Wuhan (CN); Lei Jin, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 160 days.

(21) Appl. No.: 18/528,214

(22) Filed: Dec. 4, 2023

(65) Prior Publication Data

US 2025/0068558 A1 Feb. 27, 2025

(30) Foreign Application Priority Data

Aug. 21, 2023 (CN) ......................... 202311056685.7

(51) Int. Cl.

| | |
|---|---|
| ***G11C 16/04*** | (2006.01) |
| ***G06F 12/02*** | (2006.01) |
| ***G11C 16/16*** | (2006.01) |
| ***G11C 16/34*** | (2006.01) |

(52) U.S. Cl.

CPC ...... *G06F 12/0246* (2013.01); *G11C 16/0483* (2013.01); *G11C 16/16* (2013.01); *G11C 16/3445* (2013.01); *G11C 16/3459* (2013.01)

(58) Field of Classification Search

CPC . G06F 12/0246; G11C 16/0483; G11C 16/16; G11C 16/3445; G11C 16/3459; G11C 16/08; G11C 16/10; G11C 16/12; G11C 16/14; G11C 16/3404; G11C 16/3436

USPC .................................................... 365/185.269

See application file for complete search history.

(56) References Cited

U.S. PATENT DOCUMENTS

| | | | | |
|---|---|---|---|---|
| 7,433,231 | B2 * | 10/2008 | Aritome | H10B 69/00 365/185.24 |
| 10,163,511 | B2 * | 12/2018 | Nam | G11C 11/4087 |
| 12,190,954 | B2 * | 1/2025 | Lee | G11C 16/10 |
| 12,211,558 | B2 * | 1/2025 | Uchimura | G11C 11/5635 |

* cited by examiner

*Primary Examiner* — Tha-O H Bui

(74) *Attorney, Agent, or Firm* — Conley Rose, P.C.

(57) ABSTRACT

A method for operating a memory includes: during the erase phase, applying an erase voltage to the word line, and applying an erase voltage to the select line coupled to a target select gate; during the program phase for select gate, applying a pass voltage to the word line, and applying a program voltage to the select line coupled to the target select gate.

20 Claims, 14 Drawing Sheets

MULTI-PHASE METHOD FOR OPERATING A MEMORY WITH ERASE VERIFICATION, MEMORY AND, MEMORY SYSTEM

CROSS-REFERENCE TO RELATED APPLICATIONS

The present application claims priority to Chinese Patent Application No. 2023110566857, which was filed Aug. 21, 2023, is titled "A METHOD OF OPERATING A MEMORY, A MEMORY AND A MEMORY SYSTEM," and is hereby incorporated herein by reference in its entirety.

TECHNICAL FIELD

The disclosure relates to the technical field of semiconductor chips, and in particular to a method for operating a memory, a memory and a memory system.

BACKGROUND

With the increasing development of three-dimensional flash memory (3D NAND), the density of memory cell is getting higher and higher. However, the size of Complementary Metal Oxide Semiconductor (CMOS) circuit design also continues to be reduced, and the drive capability of the array voltage is limited due to the reduction in peripheral circuit area, therefore resulting in an increase in program time. The program operation requires gradually increasing the voltage to a target value over a specified period of time to properly program the memory cell. If the array voltage does not rise quickly enough, program time will increase.

SUMMARY

Examples disclosed in this application provide a method for operating a memory, a memory and a memory system.

Examples of the present disclosure adopt the following technical solutions:

In a first aspect, a method for operating a memory is provided, wherein the memory includes a plurality of memory strings, the memory string includes a plurality of memory cells and a plurality of select gates, the memory cell is coupled to a word line, and the select gate is coupled to select line, the method includes: in the erase phase, applying an erase voltage to the word line, and applying an erase voltage to the select line coupled to a target select gate from the plurality of select gates; in the program phase for select gate, applying a pass voltage to the word line, and applying a program voltage to the select line coupled to the target select gate.

The method of operating a memory provided by the present disclosure simultaneously erases and programs the select gate during the process of erasing the memory cell, thereby recalibrating the threshold voltage of the select gate which may bring a risk of failure, the risk of failure refers to a threshold voltage drift of the select gate. By resetting the state of the select gate, its potential failure problem is eliminated, and the threshold voltage is recalibrated to the expected range, thus the reliability and stability of the select gate are improved, and further the realization of the electrical separation function is ensured.

In some examples, an erase-verify phase is further included after the erase phase and before the program phase for select gate, and the method further includes: in the erase-verify phase, applying a first verify voltage to the select line coupled to the target select gate.

The method for operating a memory provided by the present disclosure may ensure that all bottom select gates are in the same state after being erased through the erase-verify operation, thereby making it more convenient to subsequently recalibrate the threshold voltage of the select gate to the expected range.

In some examples, the select gate includes a top select gate and a bottom select gate, and the target select gate is the bottom select gate, the method further includes: in the program phase for select gate, applying a program select voltage to the top select gate of the memory string at which the target select gate is located, and applying a program prohibition voltage to the top select gates of other memory strings.

The method for operating a memory provided by the present disclosure enables different bottom select gates to be programmed to their corresponding target threshold voltages through applying different voltages to different top select gates.

In some examples, a program-verify phase for select gate is further included after the program phase for select gate, and the method further includes: in the program-verify phase for select gate, applying a second verify voltage to the select line coupled to the target select gate; increasing the program voltage in the case that the threshold voltage of the target select gate does not reach the target threshold voltage.

In some examples, the method further includes: in the program-verify phase for select gate, applying a program select voltage to the top select gate of the memory string at which the target select gate is located, and applying a pass voltage to the top select gates of other memory strings.

The method for operating a memory provided by the present disclosure performs different voltage operations on the top select gates of different memory strings to ensure that a program-verify operation will be performed only on the memory string at which the target bottom select gate is located, thereby avoiding other memory strings from being mis-operated.

In some examples, the method further includes: in the program-verify phase for select gate, applying a pass voltage to the word line. In some examples, the method further includes: in the erase phase, applying a hold & release voltage to the top select gate. In some examples, a pre-program phase is further included before the erase phase, and the method further includes: in the pre-program phase, apply a pre-program voltage or a pass voltage to the word line, and apply a pre-program voltage to the select line coupled to the target select gate.

The method for operating a memory provided by the present disclosure ensures that the selected select gates after being erased have the same threshold voltage through performing a pre-program operation on the select gates, which causes the select gates have better consistency.

In a second aspect, a memory is provided, the memory includes an array of memory cells and a peripheral circuit coupled to the array of memory cells, the peripheral circuit is configured to: in the erase phase, apply an erase voltage to the word line, and apply an erase voltage to the select line coupled to a target select gate; in the program phase for select gate, apply a pass voltage to the word line, and apply a program voltage to the select line coupled to the target select gate.

In some examples, an erase-verify phase is further included after the erase phase and before the program phase for select gate, and the peripheral circuit is further configured to: in the erase-verify phase, apply a first verify voltage to the select line coupled to the target select gate.

In some examples, the select gate includes a top select gate and a bottom select gate, and the target select gate is a bottom select gate, and the peripheral circuit is further configured to: in the program phase for select gate, applying a program select voltage to the top select gate of the memory string at which the target select gate is located, and applying a program prohibition voltage to the top select gates of other memory strings.

In some examples, a program-verify phase for select gate is further included after the program phase for select gate, and the peripheral circuit is further configured to: in the program-verify phase for select gate, apply a second verify voltage to the select line coupled to the target select gate; increase the program voltage in the case that the threshold voltage of the target select gate does not reach the target threshold voltage.

In some examples, the select gate further includes a top select gate, and the peripheral circuit is further configured to: in the program-verify phase for select gate, apply a program select voltage to the top select gate of the memory string at which the target select gate is located, and apply a pass voltage to the top select gates of other memory strings.

In some examples, the peripheral circuit is further configured to: in the program-verify phase for select gate, applying a pass voltage to the word line.

In some examples, the peripheral circuit is further configured to: in the erase phase, applying a hold & release voltage to the top select gate.

In some examples, a pre-program phase is further included before the erase phase, and the peripheral circuit is further configured to: in the pre-program phase, apply a pre-program voltage or a pass voltage to the word line, and apply a pre-program voltage to the select line coupled to the target select gate.

In a third aspect, a memory system is provided, the memory system includes a memory controller and the memory in the first aspect described above, and the memory controller is configured to control the memory.

In a fourth aspect, a computer-readable storage medium is provided, the computer-readable storage medium having computer-executable instructions stored thereon that when executed by a processor, implement any method of the second aspect described above.

In a fifth aspect, a computer device is provided, including a processor and a readable storage medium coupled to the processor, wherein the readable storage medium having executable instructions stored thereon that when executed by the processor, implement any method of the second aspect described above.

It may be understood that the technical effects of the second to fifth aspects refer to the technical effects of the first aspect and any of its examples, which will not be repeated here.

DETAILED DESCRIPTION

Figure 1:
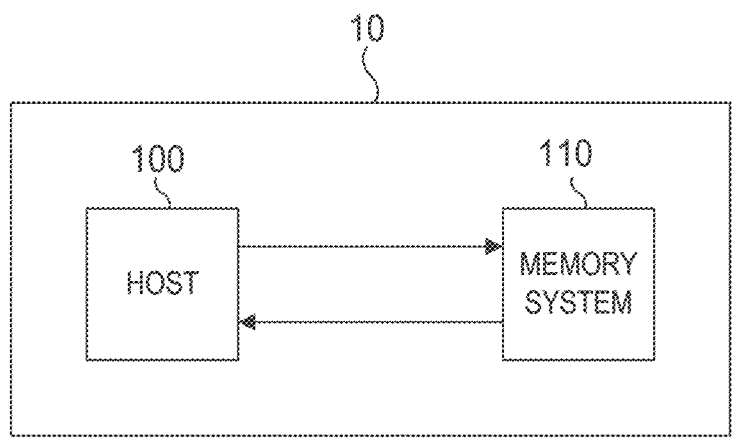
FIG. 1 is a block diagram of an electronic device according to some examples of the present disclosure.

Examples of the present disclosure will be described below in conjunction with the accompanying drawings. The described examples are only some, not all of examples of the present disclosure. All other examples obtained by those skilled in the art based on the examples provided in the present disclosure belong to the claimed scope of the present disclosure.

Unless the context requires otherwise, throughout the description and claims, the term "comprising" is interpreted as open and inclusive, e.g., "including, but not limited to". In the description of the present disclosure, the terms "one example", "some examples", "exemplary example", "exemplarily" or "some examples" are intended to indicate that a particular feature, structure, material, or characteristic related to the example is included in at least one example or example of the present disclosure. Illustrative representations of the terms described above are not necessarily referring to a same example. Furthermore, particular feature, structure, material or characteristic described above may be included in any suitable manner in any one or more examples.

Hereinafter, the terms "first" and "second" are used for descriptive purposes only, and should not be understood as indicating or implying relative importance or implicitly specifying the quantity of indicated technical features. Thus, a feature defined as "first" and "second" may explicitly or implicitly include one or more of these features. In the description of examples of the present disclosure, "plurality" means two or more, unless specified otherwise.

In describing some examples, the expressions "coupling" and their derivatives may be used. For example, in describing some examples, the term "coupling" may be used to indicate that two or more elements are in direct physical or electrical contact, in this case, "coupling" may also be described as "connecting". Additionally, the term "coupling" may also mean that two or more elements are not in direct contact with each other, but yet still co-operate or interact with each other. Examples disclosed herein are not necessarily limited by the context herein.

"At least one of A, B and C" has the same meaning as "at least one of A, B or C" and both include the following combinations of A, B and C: only A; only B; only C; combination of A and B; combination of A and C; combination of B and C; and combination of A, B and C.

"A and/or B" includes the following three combinations: only A; only B; only C; and combination of A and B. The use of "suitable for" or "configured to" herein means open and inclusive language that does not exclude devices that are suitable for or configured to perform additional tasks or operations. Additionally, the use of "based on" is meant to be open and inclusive, as a process, operation, calculation, or other action that is "based on" one or more conditions or values may in practice be based on additional conditions or beyond values.

The use of "configured to" herein means open and inclusive language that does not exclude devices that are suitable for or configured to perform additional tasks or operations.

An example of the present disclosure provides an electronic device, which may be, e.g., any one of mobile phone, desktop computer, tablet computer, notebook computer, server, vehicle-mounted device, wearable device (e.g., smart watch, smart bracelet, smart glasses, etc.), mobile power supply, game console, digital multimedia player, etc. Referring to FIG. 1, FIG. 1 shows a schematic diagram of an electronic device 10 provided by an example of the present disclosure, which includes a host 100 and a memory system 110, the host 100 is coupled with the memory system 110 to write data to the memory system 110 or read data stored in the memory system 110. The host is also referred to as a master device, and the memory system is also referred to as a slave device. In electronic devices, a slave device may be accessed by different master devices, e.g., taking the electronic device being a mobile phone as an example, central processing unit (CPU), digital signal processing (DSP), etc., of a mobile phone may each serve as a host to access the memory system.

Figure 2:
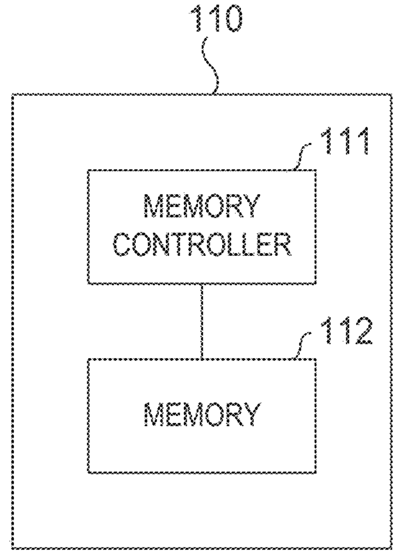
FIG. 2 is a block diagram of a memory system according to some examples of the present disclosure.

For example, referring to FIG. 2, FIG. 2 shows a schematic diagram of a memory system 110 provided by an example of the present disclosure. The memory system 110 includes a memory controller 111 and a memory 112. The memory controller 111 is coupled to the memory 112 to control the memory 112 to store data. The memory 112 may comprise a 2-dimensional (2D) memory or a 3-dimensional (3D) memory.

The memory system 110 may be integrated into various types of storage devices, e.g., included in a same package (e.g., universal flash storage (UFS) package or embedded multi media card (eMMC) package). For example, the memory system 110 may be applied to and packaged in different types of electronic products, e.g., a mobile phones (e.g., a cell phone), a desktop computer, a tablet computer, a notebook computer, a server, a vehicle-mounted equipment, a game console, a printer, a positioning device, a wearable device, a smart sensor, a mobile power, a virtual reality (VR) device, an augmented reality (AR) device, or any other suitable electronic device having a memory therein.

In some examples, the memory system 110 includes a memory controller 111 and a memory 112, and the memory system 110 may be integrated into a memory card. Memory card includes any one of personal computer memory card international association (PCMCIA) card (abbreviated as PC card), compact flash (CF) card, smart media (SM) card, memory stick, multi media card (MMC), secure digital memory (SD) card, and UFS.

Figure 3:
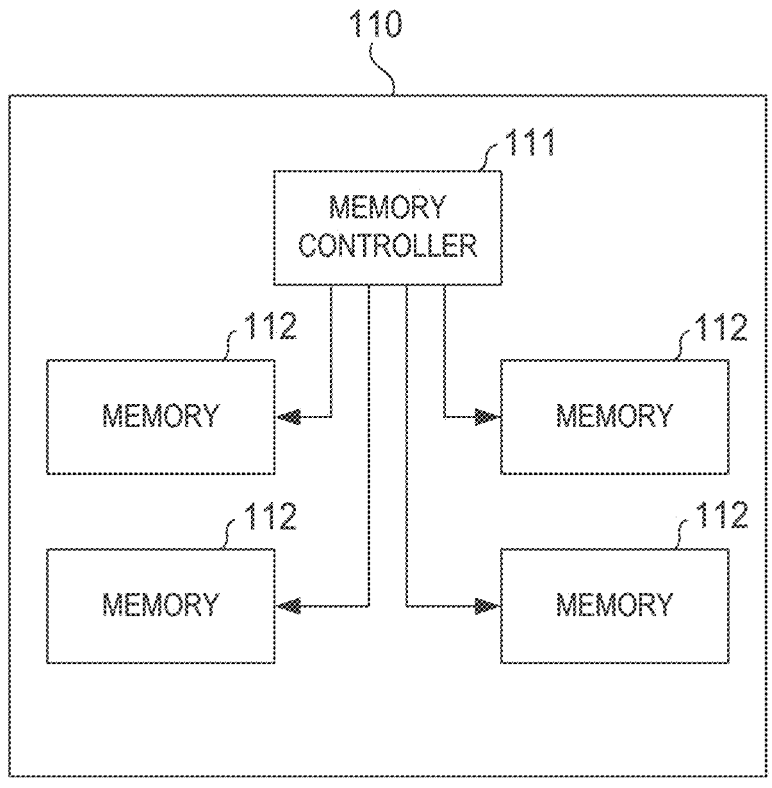
FIG. 3 is a block diagram of another memory system according to some examples of the present disclosure.

In other examples, referring to FIG. 3, the memory system 110 includes a memory controller 111 and a plurality of memories 112, and the memory system 110 is integrated into a solid state drive (SSD).

In the memory system 110, in some examples, the memory controller 111 is configured to operate in a low duty cycle environment, e.g., a SD card, CF card, universal serial bus (abbreviated as USB) Flash drive or other media used in an electronic device such as a personal calculator, a digital camera, a mobile phone, etc.

In other examples, memory controller 111 is configured to operate in a high duty cycle environment SSD or eMMC, where SSD or eMMC is used for data memory of mobile devices such as a smartphone, a tablets, a laptop, and an enterprise storage array.

In some examples, memory controller 111 may be configured to manage data stored in memory 112 and communicate with an external device (e.g., host 100). In some examples, memory controller 111 may also be configured to control operations of memory 112, e.g., read, erase, and program operations. In some examples, the memory controller 111 may be further configured to manage various functions related to data stored or to be stored in memory 112, including at least one of bad block management, garbage collection (GC), logical-to-physical address translation, wear leveling, etc. In some examples, memory controller 111 is also configured to process error correction code related to data read from or written to memory 112.

Additionally, the memory controller 111 may communicate with an external device (e.g., host 100) through at least one of various interface protocols. It should be noted that an interface protocol includes at least one of universal serial bus (USB) protocol, Microsoft management console (MMC) protocol, peripheral component interconnect, PCI protocol, peripheral component interconnect express (PCI-E) protocol, advanced technology attachment (ATA) protocol, serial ATA protocol, parallel ATA protocol, small computer system interface (SCSI) protocol, enhanced small disk interface (ESDI) protocol, integrated drive electronics (IDE) protocol, and firewire protocol.

For example, taking the storage medium of the memory 112 being a flash memory as an example, the basic storage unit of the flash memory includes a floating gate field effect transistor or a charge trapping type transistor, etc., and an example of the present disclosure takes a charge trapping type transistor as an example for description.

Figure 4:
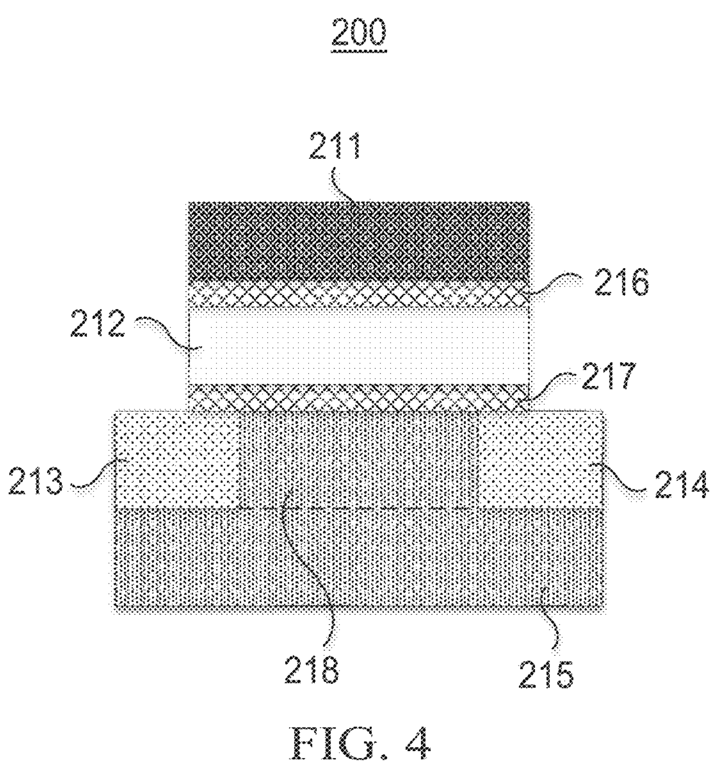
FIG. 4 is a schematic diagram of a floating gate field effect transistor according to some examples of the present disclosure.

Referring to FIG. 4, FIG. 4 shows a structure schematic diagram of a charge trapping type transistor, including a control gate 211, a charge trapping layer 212, a source 213, a drain 214, a substrate 215, an oxide layer 216 and a tunnel oxide layer 217. The source 213 and the drain 214 are disposed on the substrate 215. An example of the present disclosure takes an N-channel charge trapping layer field effect transistor as an example, wherein the substrate 215 is made of P-type semiconductor material, and the source 213 and the drain 214 are made of N-type semiconductor material. The substrate material between the source 213 and the drain 214 may form a conductive channel 218, a charge trapping layer 212 overlays over the conductive channel 218, a tunnel oxide layer 217 is located between the charge trapping layer 212 and the conductive channel 218, and separates the charge trapping layer 212 from the source 213, the drain 214 and the conductive channel 218. A control gate 211 is disposed on the charge trapping layer 212, and an oxide layer 216 is disposed between the control gate 211 and the charge trapping layer 212 to separate the control gate 211 from the charge trapping layer 212, both the oxide layer 216 and the tunnel oxide layer 217 are made of insulating material, e.g., silicon dioxide (SiO2).

The charge trapping layer 212 is made of insulating material with a high charge trapping density, during the process of writing data, the charge trapping layer 212 captures electrons, and the threshold voltage of the field effect transistor changes, data is stored by such characteristics, and during the process of erasing data, holes in the channel are injected into the charge trapping layer 212, and neutralized with electrons in the charge trapping layer 212 to achieve the erasure operation.

When the charge trapping layer captures electrons, due to the shielding effect of the electrons, a higher threshold voltage is required to open the conductive channel. When electrons are not captured in the charge trapping layer, the threshold voltage is recorded as Vth1, and when electrons are captured in the charge trapping layer, the threshold voltage is recorded as Vth2, then assume that a voltage which is greater than Vth1 and less than Vth2 is tried to turn on the charge trapping type transistor, if the charge trapping field effect transistor is turned on, it may be determined that no electrons are captured in the charge trapping layer, and if the charge trapping type transistor is not turned on, then it may be determined that electrons are captured in the charge trapping layer, based on this logic, when electrons are not captured on the charge trapping layer, the charge trapping type transistor is in an turn-on state, indicating 1, and when electrons are captured on the charge trapping layer, the charge trapping type transistor is in an turn-off state, indicating 0, therefore, such different states may be used to store data, and the storage function may be implemented by injecting or capturing electrons in the charge trapping layer to change the threshold voltage of the charge trapping type transistor.

Figure 5A:
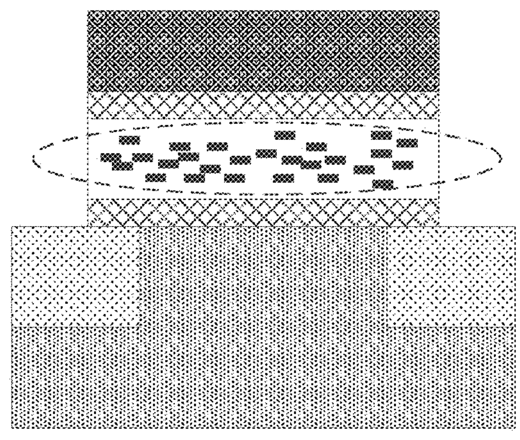
FIGS. 5A and 5B (collectively referred to as FIG. 5) are schematic diagrams of data storage by a floating gate field effect transistor according to some examples of the present disclosure.
Figure 5B:
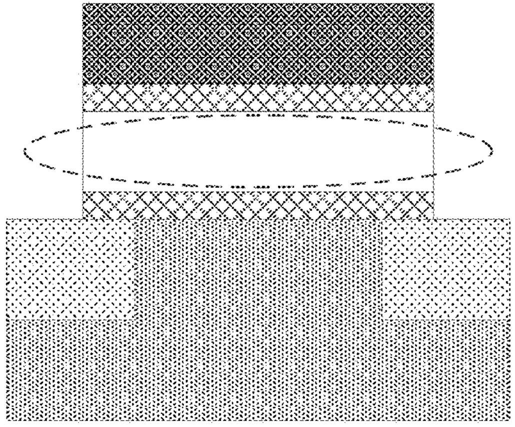

When a voltage is applied to the control gate, a tunneling effect occurs based on the potential difference between the control gate and the channel, and electrons may be injected into the charge trapping layer or captured by the charge trapping layer. In the time of storing data, the data is stored in the charge trapping layer, and the presence or absence of charge in the charge trapping layer may be used to indicate the data currently stored in the memory cell. For example, referring to FIG. 5, as shown in FIG. 5A, the state in which charge is in the charge trapping layer indicates that 0 is stored, and as shown in FIG. 5B, the state in which no charge is in the charge trapping layer indicates that 1 is stored.

To increasingly improve memory density and capacity, many memory designers and manufacturers have changed the traditional 2D integration model and adopted three-dimensional stacking technology to increase the storage density of NAND flash memory. In this context, manufacturers may desire to achieve shorter program times during programming, because this may bring various advantages. First, shorter program times may significantly speed up the read and write of data. Programming is the process of performing write operations on a single memory cell in the memory, these operations may be completed quickly with shorter program time, and response speed and data transfer efficiency of the memory are improved, thereby the overall performance of the system is improved.

Second, shorter program time may improve the performance of a memory device. In 3D NAND memory, memory cells are stacked on multiple levels, which increases storage density. However, a long programming process may result in mutual interference and cross-interference between memory cells, thus affecting the stability and data reliability of the memory. By shortening the program time, the possibility of such interference may be reduced, the stability of the memory may be improved, and problems such as data loss and mis-write may be avoided, thereby the performance and reliability of the memory device may be improved.

Finally, shorter program time may facilitate reducing the chance of electron migration, thereby extending the lifetime of a memory. In a memory, a long time for program operations may cause electrons to migrate in small structures, resulting in data loss and bit flips, which in turn reduces the lifetime of the flash memory chip. By shortening the program time, the loss caused by electron migration may be reduced and the service life of the memory may be extended, thus the durability and reliability of the memory may be improved.

One possible example is to improve the program time through reducing the impact of the parasitic RC (Resistor-Capacitor) impact of the non-program memory string on the program memory string. The RC impact is a ubiquitous non-ideal effect in integrated circuits, which refers to the impact induced by the mutual coupling between resistance and capacitance. This impact results in delays in circuit signal transmission and response, thereby affecting the performance of the entire circuit.

For example, during the process of programming, the parasitic RC impact of the non-program memory string will affect the program memory string, thereby affecting the program time of the program memory string. Therefore, through reducing the RC impact, the signal transmission delay may be reduced, thereby the program time may be improved.

In some examples, through programming the bottom select gate to different threshold voltages and applying different voltages to a plurality of bottom select lines, the bottom select gate is selectively turned on, thereby the effect of electrical separation is achieved, which in turn the program time is improved. For example, the parasitic RC impact of the non-program memory string will not affect the program memory string.

Figure 6:
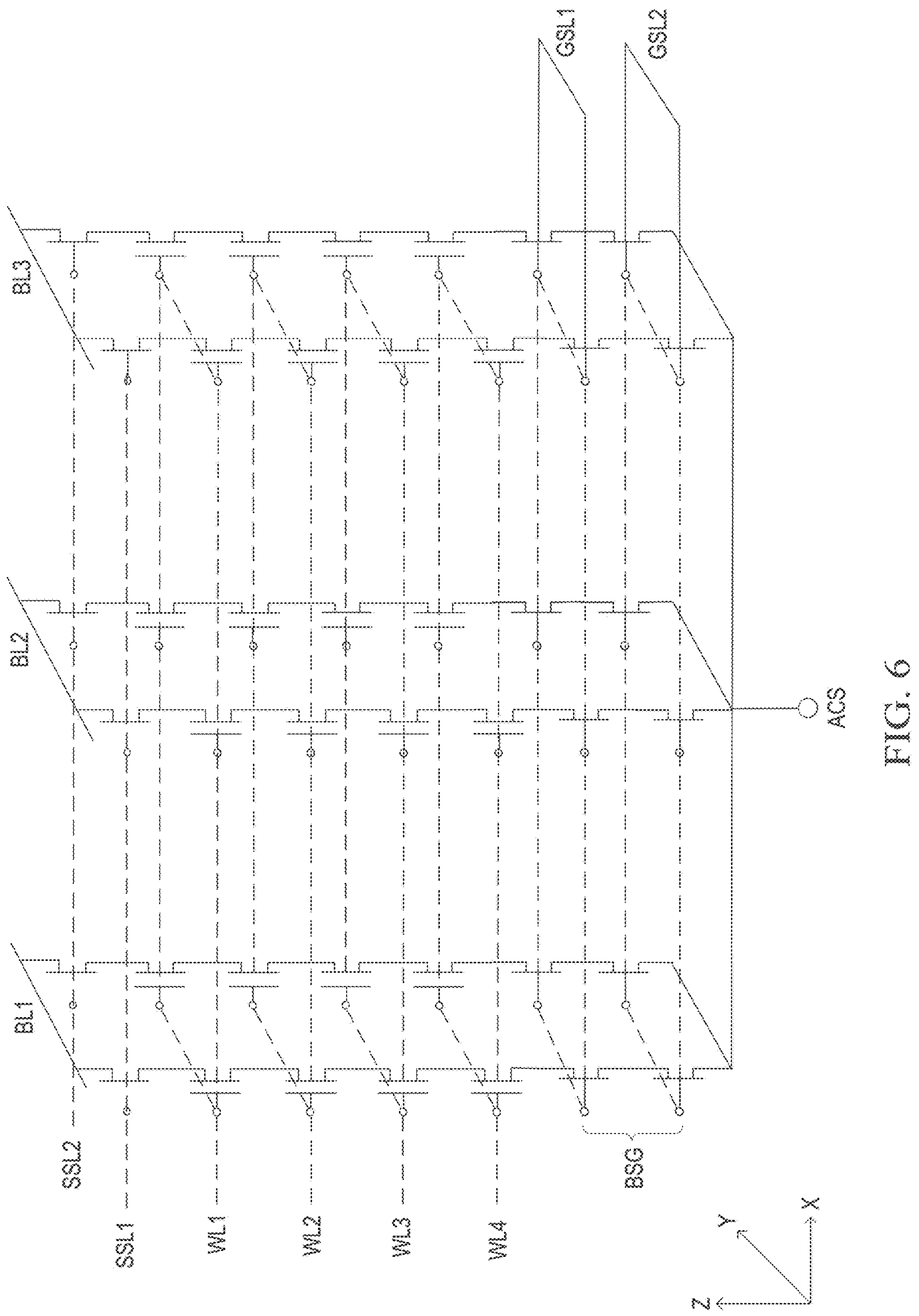
FIG. 6 is a schematic diagram of the connection structure of an array of memory cells provided by an example of the present disclosure.

Referring to FIG. 6, a structure schematic diagram of an array of memory cells provided by the present disclosure is shown. The array of memory cells 300 includes a plurality of memory cell strings 310. Each memory cell string 310 couples with peripheral circuits through String select line (SSL), word line (WL), bit line (BL), ground select line (GSL), Source line (SL), etc. The memory cell string 310 includes a top select gate (TSG), a plurality of memory cells, and a bottom select gate (BSG). For bottom select gates located in different memory cell strings 310, they are all connected to the same ground select line.

As an example, the first bottom select gates of the a plurality of memory cell strings 310 are connected to the first ground select line GSL1, and the second select gates of the a plurality of memory cell strings 310 are connected to the second ground select line GSL2.

Figure 7:
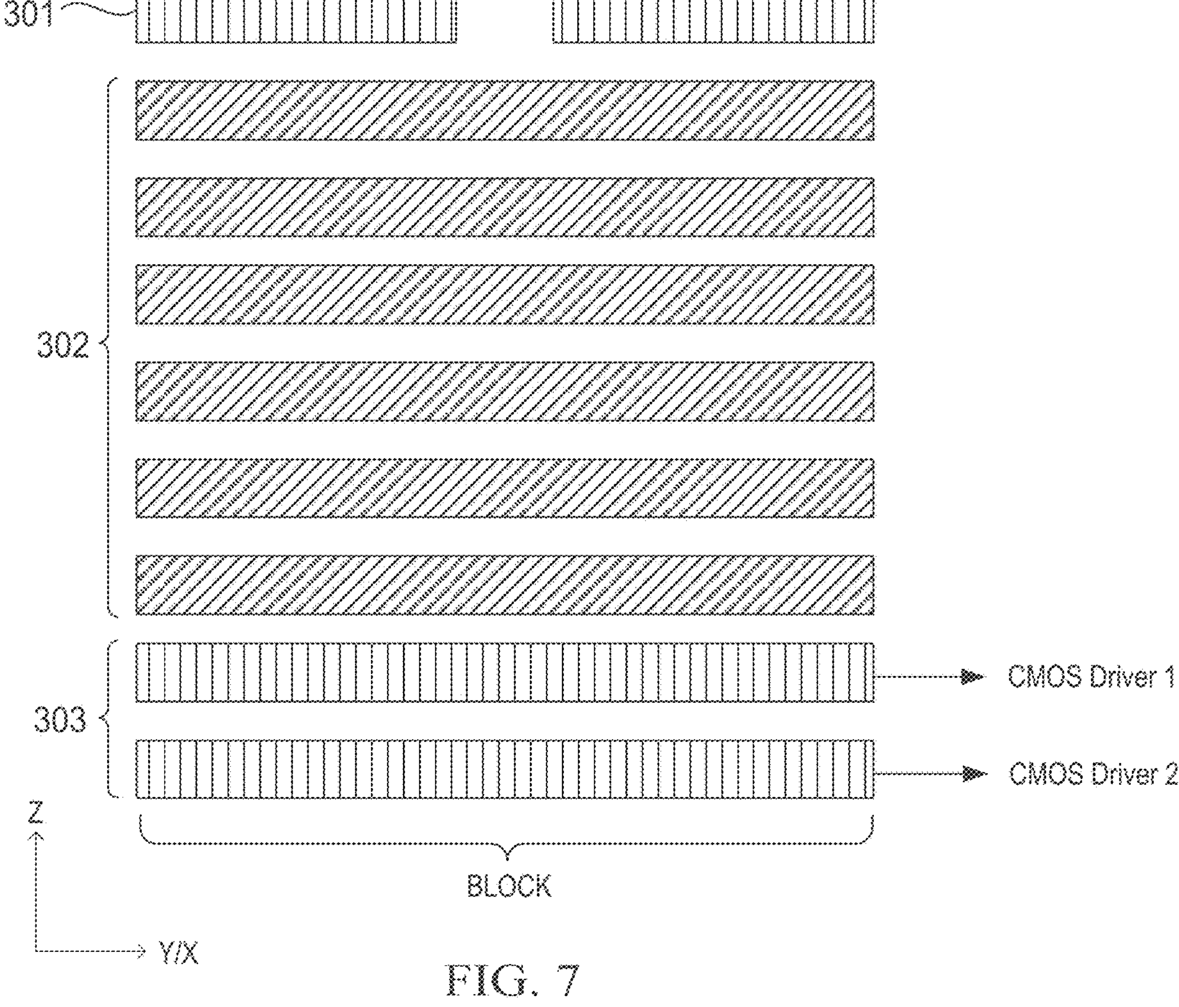
FIG. 7 is a schematic plan view of a memory provided by an example of the present disclosure.

As an example, referring to FIG. 7, the memory includes a top select gate layer 301, a word line 302 connected to the memory cells, and a bottom select gate layer 303, the first ground select line GSL1 is connected to the driving circuit CMOS Driver 1, and the second ground select line GSL2 is connected to the driver circuit CMOS Driver 2.

Figure 8:
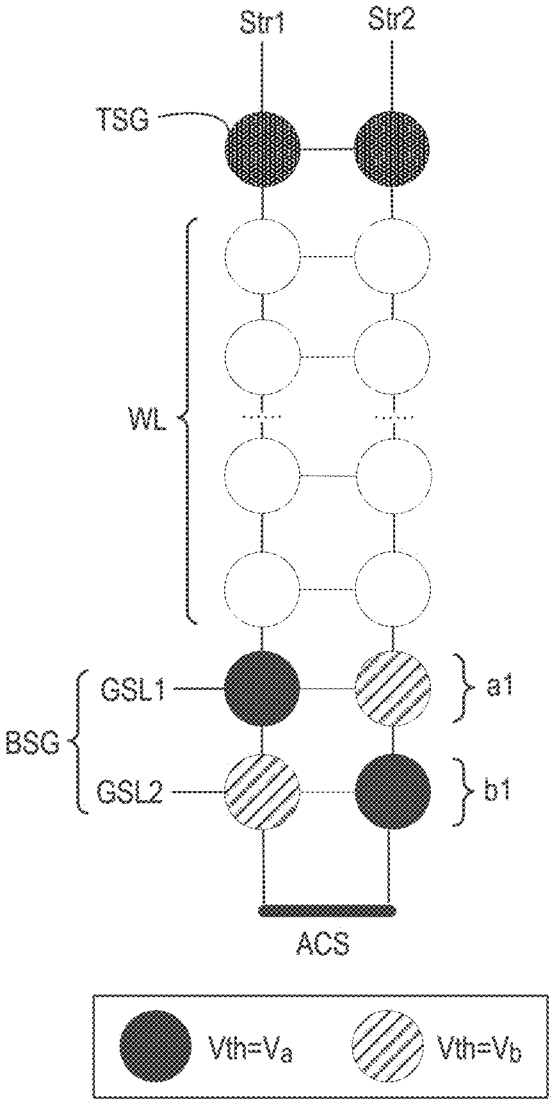
FIG. 8 is another schematic diagram of a memory provided by an example of the present disclosure.

Referring to FIG. 8, the principle of electrical separation implemented by an example of the present disclosure will be described, taking the following example: the memory string Str1 is taken as the first memory string and the memory string Str2 is taken as the second memory string. The memory string Str1 and the memory string Str2 both include a first bottom select gate and a second bottom select gate.

As an example, the first bottom select gate is close to one side of the memory cell, then the first bottom select gates on the memory string Str1 and the memory string Str2 are both connected to the first ground select line GSL1, the second bottom select gates on the memory string Str1 and the memory string Str2 are both connected to the second ground select line GSL2, the first bottom select gate layer al includes all first bottom select gates connected by the first ground select line GSL1, and the second bottom select gate layer b1 includes all second bottom select gates connected by the second ground select line GSL2.

Figure 9:
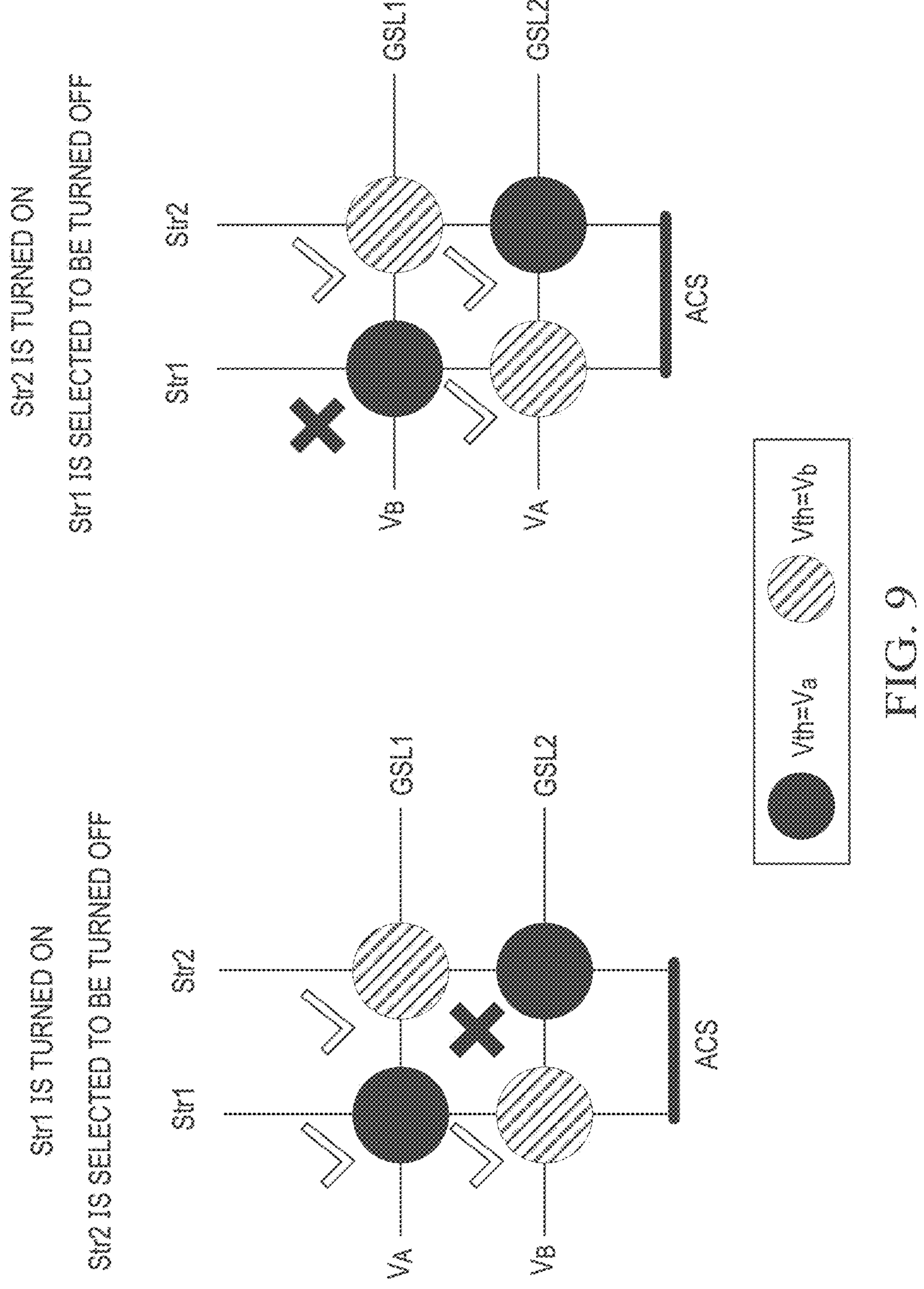
FIG. 9 is a schematic diagram of the process of selectively turning off the bottom select gate provided by an example of the present disclosure.

In a possible example shown in FIG. 9, the threshold voltage of the first bottom select gate on the memory string Str1 which is close to the memory cell is the first threshold voltage Va. The threshold voltage of the second bottom select gate on the memory string Str1 which is close to the source ACS is the second threshold voltage Vb. The threshold voltage of the first bottom select gate on the memory string Str2 which is close to the memory cell is the second threshold voltage Vb. The threshold voltage of the second bottom select gate on the memory string Str2 which is close to the source ACS is the first threshold voltage Va.

The first threshold voltage Va is greater than the second threshold voltage Vb. The threshold voltage of the bottom select gate on the memory string Str1 which is close to the memory cell and the threshold voltage of the bottom select gate on the memory string Str2 which is close to the source ACS may be within a same range for the threshold voltage. The threshold voltage of the bottom select gate on the memory string Str1 which is close to the source ACS and the threshold voltage of the bottom select gate on the memory string Str2 which is close to the source ACS may be within a same range for the threshold voltage. Because it is difficult to achieve that threshold voltages of any two bottom select gates are the same, if any two bottom select gates are within a same range for the threshold voltage, it may be considered that the two bottom select gates have the same threshold voltage.

Next, the case of selectively turning off the memory string Str1 and the memory string Str2 will be further described with reference to the content shown in FIG. 9.

For the convenience of subsequent description, the way for naming the bottom select gate is described, the naming is according to the position of the ground select line and the memory string at which the bottom select gate is located the. If the bottom select gate is located on Str1 and the first ground select line GSL1, the bottom select gate is labeled as G1Str1. Similarly, if the bottom select gate is located on Str2 and the second ground select line GSL2, the bottom select gate is labeled as G2Str2.

As an example, the threshold voltages of the first bottom select gate G1Str1 on the memory string Str1 and the second bottom select gate G2Str2 on the memory string Str2 are both Va, and the threshold voltages of the second bottom select gate G2Str1 on the memory string Str1 and the first bottom select gate G1Str2 on the memory string Str2 are both Vb. During the process for the program-verify of the memory cells on the memory string Str1, when the memory string Str2 is selectively turned off, a first voltage VA is applied to the first ground select line GSL1, and a second voltage VB is applied to the second ground select line GSL2. The first voltage VA is greater than the second voltage VB, the first voltage VA is greater than the threshold voltage Va, the second voltage VB is greater than the threshold voltage Vb, and the second voltage VB is less than the threshold voltage Va.

When the memory string Str1 is turned on and the memory string Str2 is selected to be turned off, when the first voltage VA is applied to the first ground select line, because the first voltage VA is greater than the threshold voltage Va of the first bottom select gate G1Str1 on the memory string Str1 and the threshold voltage Vb of the first bottom select gate G1Str2 on the memory string Str2, the first bottom select gates on the memory string Str1 and the memory string Str2 are both turned on.

When the second voltage VB is applied to the second ground select line GSL2, because the second voltage VB is greater than the threshold voltage Vb of the second bottom select gate G2Str1 on the memory string Str1, the second bottom select gate G2Str1 on the memory string Str1 is turned on. Because the second voltage VB is less than the threshold voltage Va of the second bottom select gate G2Str2 on the memory string Str2, the second bottom select gate G2Str2 on the memory string Str2 is turned off.

Based on the operations described above, the first bottom select gate G1Str1 and the second bottom select gate G2Str1 on the memory string Str1 are both turned on, thus the memory string Str1 is turned on. Also, the first bottom select gate G1Str2 on the memory string Str2 is turned on, and the second bottom select gate G2Str2 is turned off, thus the memory string Str2 is selected to be turned off.

When the memory string Str2 is turned on and the memory string Str1 is selected to be turned off, the second voltage VB is applied to the first ground select line GSL1. Because the second voltage VB is less than the threshold voltage Va of the first bottom select gate G1Str1 on the memory string Str1, the first bottom select gate G1Str1 on the memory string Str1 is turned off. Because the second voltage VB is greater than the threshold voltage Vb of the first bottom select gate G1Str2 on the memory string Str2, the first bottom select gate G1Str2 on the memory string Str2 is turned on.

When the first voltage VA is applied to the second ground select line GSL2, because the first voltage VA is greater than the threshold voltage Vb of the second bottom select gate G2Str1 on the memory string Str1 and the threshold voltage Va of the second bottom select gate G2Str2 on the memory string Str2, the second bottom select gates on the memory string Str1 and the memory string Str2 are turned on, e.g., G2Str1 and G2Str2 are turned on.

Based on the operations described above, the first bottom select gate G2Str1 and the second bottom select gate G2Str2 on the memory string Str2 are both turned on, thus the bottom select gate on the memory string Str2 is turned on. Also, the first bottom select gate G1Str1 on the memory string Str1 is turned off, and the second bottom select gate G2Str2 is turned on, thus the bottom select gate on the memory string Str1 is selected to be turned off.

The solution provided by the examples of the present disclosure may implement that the select gates may be selected to be turned off during the process for the program-verify of memory cells through setting different threshold voltages for different bottom select gates in different bottom select gate layers. When the selective turn-off of the select gates is implemented, the program memory string will be turned on and the non-program memory string will be turned off. Thereby, the parasitic RC impact of the non-program memory string on the program memory string may be realized, and the program time is thus reduced.

Figure 10:
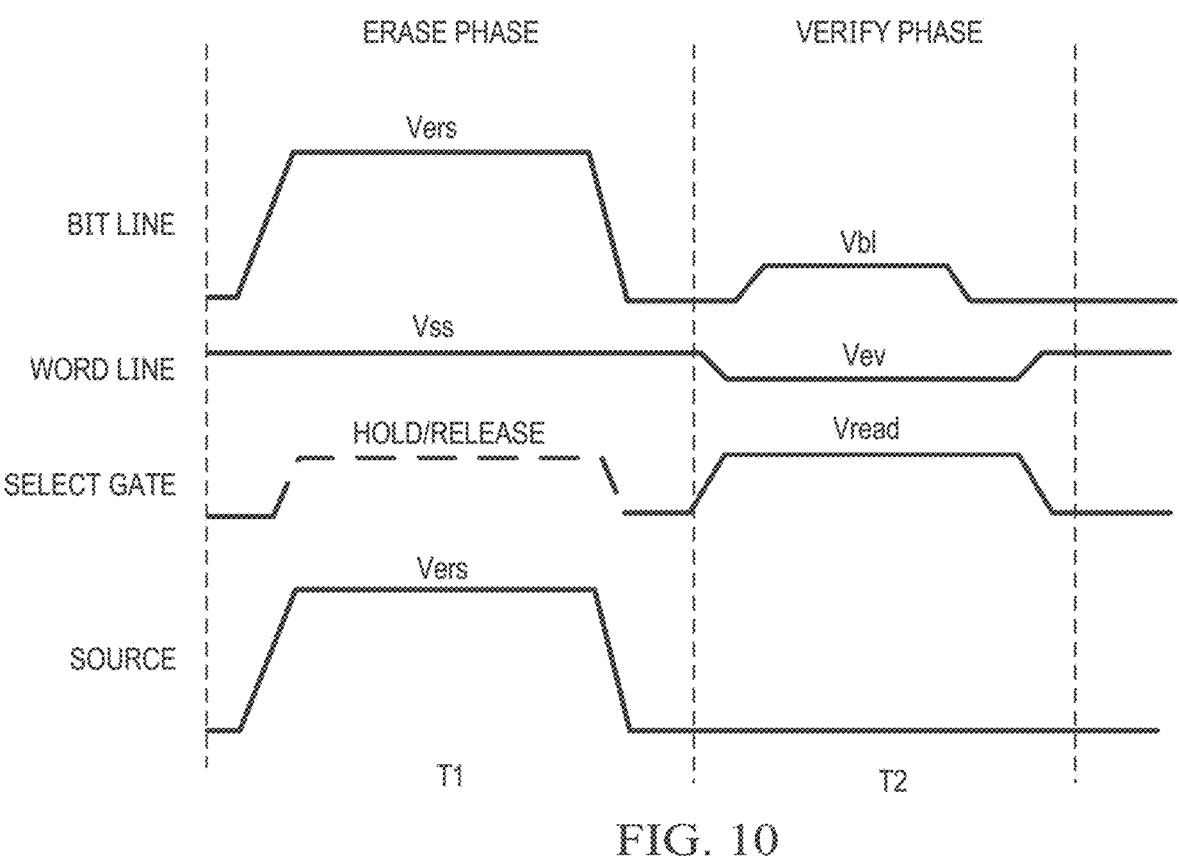
FIG. 10 is a schematic diagram of a possible voltage waveform for erasing a memory provided by an example of the present disclosure.

However, during the process of the bottom select gate performing the erase-program operation described above in cycles, a drift for the threshold voltage of the bottom select gate will occur. However, in the phases of erasing, verifying or programming of memory cells, e.g., in conjunction with FIG. 10, a pass voltage (hold/release) may be applied to the select gate. For example, during these processes, the bottom select gate may not be programmed, and the drift for the threshold voltage of the bottom select gate may result in a failure of the electrical separation function.

Figure 11:
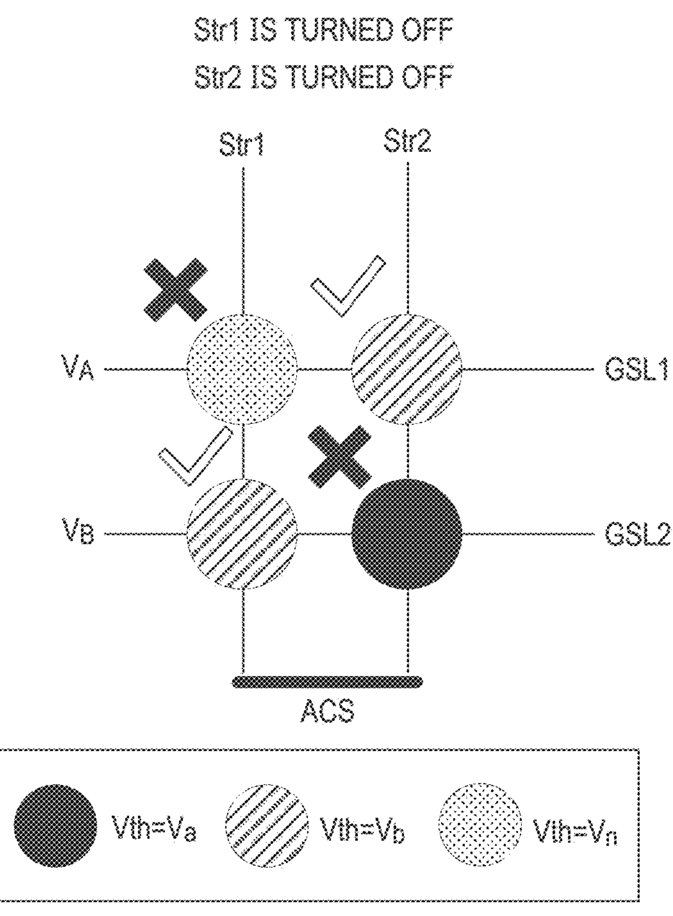
FIG. 11 is a schematic diagram of another process of selectively turning off the bottom select gate provided by an example of the present disclosure.

As an example, referring to FIG. 11, for the first bottom select gate G1Str1, its target threshold voltage is Va, and after completing one erase-program operation, a drift for its threshold voltage may occur. In one possible example, the threshold voltage drifts to Vn, and Vn>VA>Va.

When the memory string Str1 is to be turned on and the memory string Str2 is to be selected to be turned off, the first voltage VA is applied to the first ground select line, since the first voltage VA is less than the threshold voltage Vn of the first bottom select gate G1Str1 on the memory string Str1, thus the first bottom select gate on the memory string Str1 is turned off, and since the first voltage VA is greater than the threshold voltage Vb of the first bottom select gate G1Str2 on the memory string Str2, the first bottom select gate on the memory string Str2 is turned on.

When the second voltage VB is applied to the second ground select line GSL2, because the second voltage VB is greater than the threshold voltage Vb of the second bottom select gate G2Str1 on the memory string Str1, the second bottom select gate G2Str1 on the memory string Str1 is turned on. Because the second voltage VB is less than the threshold voltage Va of the second bottom select gate G2Str2 on the memory string Str2, the second bottom select gate G2Str2 on the memory string Str2 is turned off.

Based on the operations described above, on the memory string Str1, the first bottom select gate G1Str1 is turned off and the second bottom select gate G2Str1 is turned on, thus the memory string Str1 is selected to be turned off. Also, on the memory string Str2, the first bottom select gate G1Str2 is turned on, and the second bottom select gate G2Str2 is turned off, thus the memory string Str2 is selected to be turned off. Therefore, both of the memory string Str1 and the memory string Str2 are turned off, and the electrical separation function fails.

In a solution in which electrical separation is adopted but the bottom select gate is not reprogrammed, the threshold voltage drift of the bottom select gate may result in a failure of the electrical separation and thus affect the read and write performance of the memory.

Based on this, an example of the present disclosure provides a solution: the bottom select gate is erased while the memory cell is erased, and after finishing the erasing of the bottom select gate, the bottom select gate is reprogrammed to adjust its threshold voltage to the target threshold voltage to avoid a failure of electrical separation.

Figure 12:
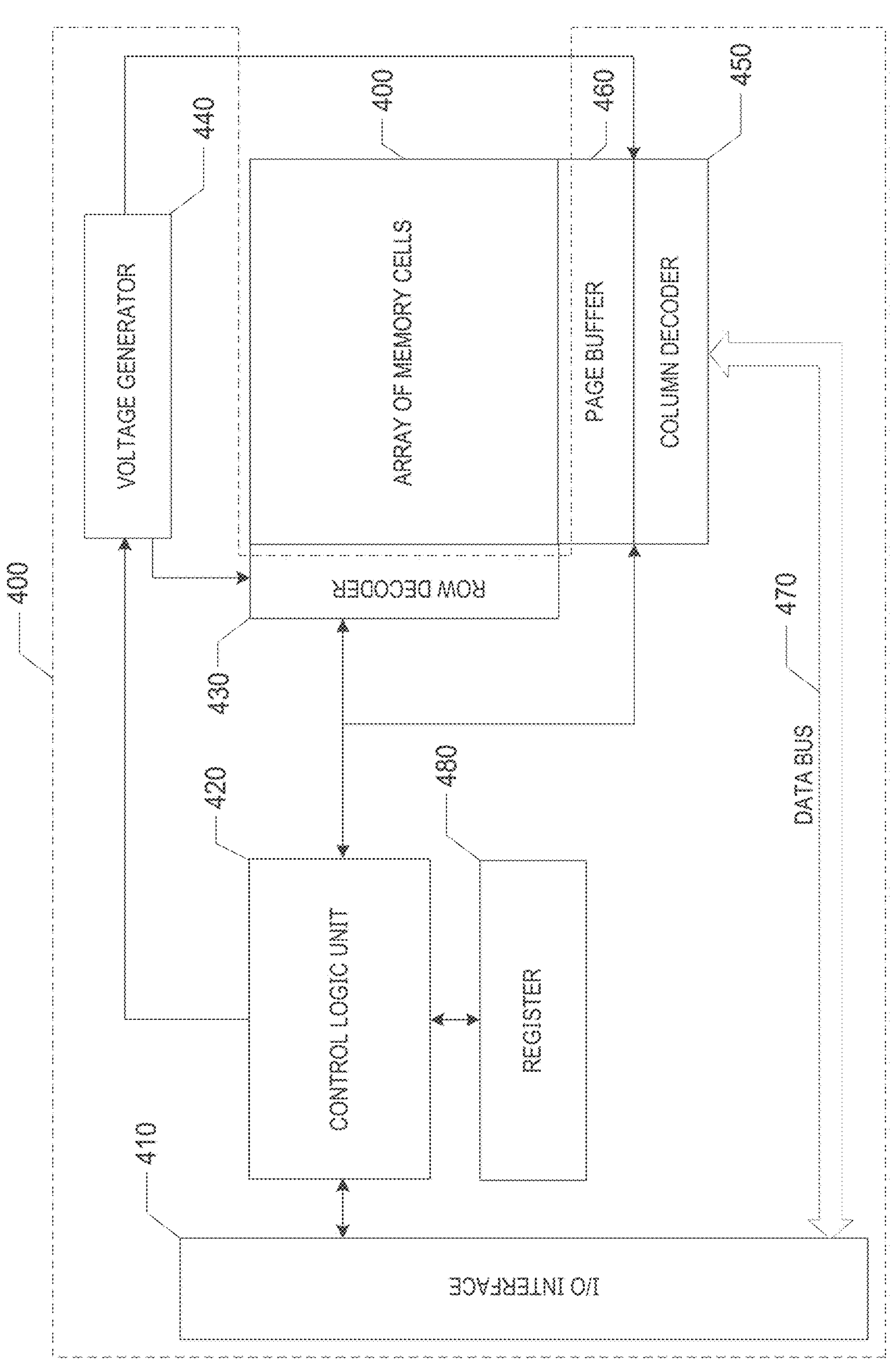
FIG. 12 is a structure schematic diagram of a memory and peripheral circuits provided by an example of the present disclosure.

FIG. 12 shows a structure schematic diagram of the memory array and peripheral circuits. In FIG. 12, peripheral circuit 400 includes I/O interface 410, control logic circuit 420, row decoder 430, voltage generator 440, column decoder 450, page buffer 460, data bus 470 and register 480. In some examples, additional circuits not shown in FIG. 12 may also be included.

I/O Interface 410 may be coupled to control logic circuit 420 and act as a control buffer to buffer a control command received from a memory controller (e.g., memory controller 111 in FIG. 2) and relay the control command to control logic 420, and to buffer state information received from the control logic unit 420 and relay the state information to the host. I/O Interface 410 may also be coupled to page buffer 460 via data bus 470 and act as a data I/O interface 410 and data buffer to buffer and relay data to/from memory cell array 300.

Control logic circuit 420 may be coupled to voltage generator 440, page buffer 460, column decoder 450, row decoder 430, I/O interface 410, etc., and configured to control operation of various peripheral circuits. The control logic circuit 420 may generate an operating signal in response to a command (CMD) or control signal from the memory controller 111, to control operations of the row decoder 430, the column decoder 450, the page buffer 460, and the voltage generator 440. The command may comprise a program command, a read command, etc.

The row decoder 430 may supply the word line voltage generated from the voltage generator 440 to the selected word lines and unselected word lines of the array of memory cells 300 in response to the control by the control logic circuit 420. As described in detail below, row decoder 430 is configured to perform program operations on memory cells coupled to one or more selected word lines in the array of memory cells 300.

The voltage generator 440 may use an external power supply voltage or an internal power supply voltage to generate various voltages for performing operations on the array of memory cells 300, such as erasing, programming, reading, and verifying.

Column decoder 450 may be controlled in response to control logic 420 and select one or more memory cell strings 310 in array of memory cells 300 through applying a bit line voltage generated from voltage generator 440.

The page buffer 460 may read data from and program (write) data to the array of memory cells 300 according to a control signal from the control logic circuit 420. In one example, the page buffer 460 may store programming data (written data) to be programmed into array of memory cells 300. In another example, page buffer 460 may perform a programming verify operation to ensure that data has been correctly programmed into memory cell coupled to the selected word line. In yet another example, page buffer 460 may also detect a low power signal from bit line representing a data bit stored in memory cell, and amplify a small voltage swing to a recognizable logic level during a read operation.

Register 480 may be coupled to the control logic circuit 420, and include state register, command register and address register for storing state information, command operation code (OP code) and command address for controlling operations of each of the peripheral circuits.

The operations performed by the row decoder 430, the page buffer 460, the control logic circuit 420, and the voltage generator 440 described in this disclosure may be performed by a processing circuit. The processing circuit may include, but is not limited to, hardware of a logic circuit or a hardware/software combination of a processor that executes software.

Figure 13:
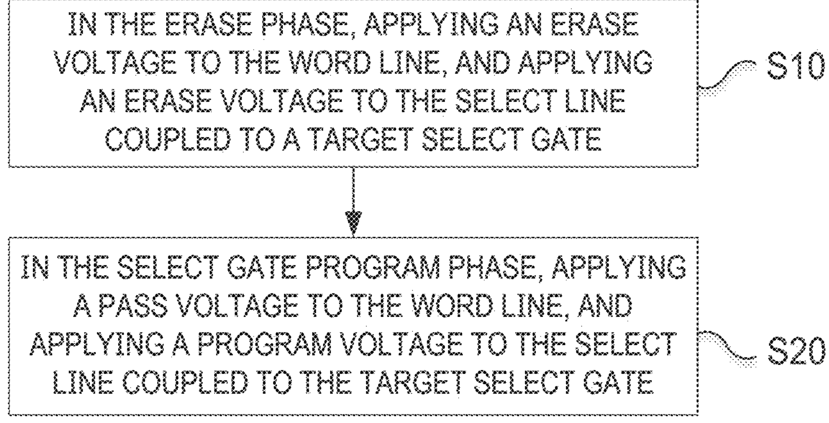
FIG. 13 is a schematic flowchart of a method for operating a memory provided by an example of the present disclosure.

In one example, when the peripheral circuit 400 described above is working, the operating method shown in FIG. 13 is performed, and the operating method includes operations S10-S20, the peripheral circuit 400 may perform at least one operation of S10 or S20.

Referring to FIG. 13, a method for operating a memory provided by an example of the present disclosure includes:

Operation S10: during the erase phase, applying an erase voltage to the word line, and applying an erase voltage to the select line coupled to a target select gate.

Because no electrical separation is adopted to shorten the program time, the threshold voltage of the select gate will not be adjusted. Continuing to refer to FIG. 10, because an erase cycle only includes the erase phase and the erase-verify phase for memory cell, the erase operation of the memory cell is performed in the time period corresponding to T1, and the erase-verify operation of the memory cell is performed in the time period corresponding to T2, and hold & release voltage (hold & release) is applied to both of the top select gate and the bottom select gate. Therefore, both of the top select gate and the bottom select gate are to be in a hold & release state first, and then in a floating state. When the top select gate and the bottom select gate are in a floating state, the potentials of the top select gate and the bottom select gate are the same as the channel potential, which ensures that the top select gate and the bottom select gate will not be erased when the memory cell is erased.

Figure 14:
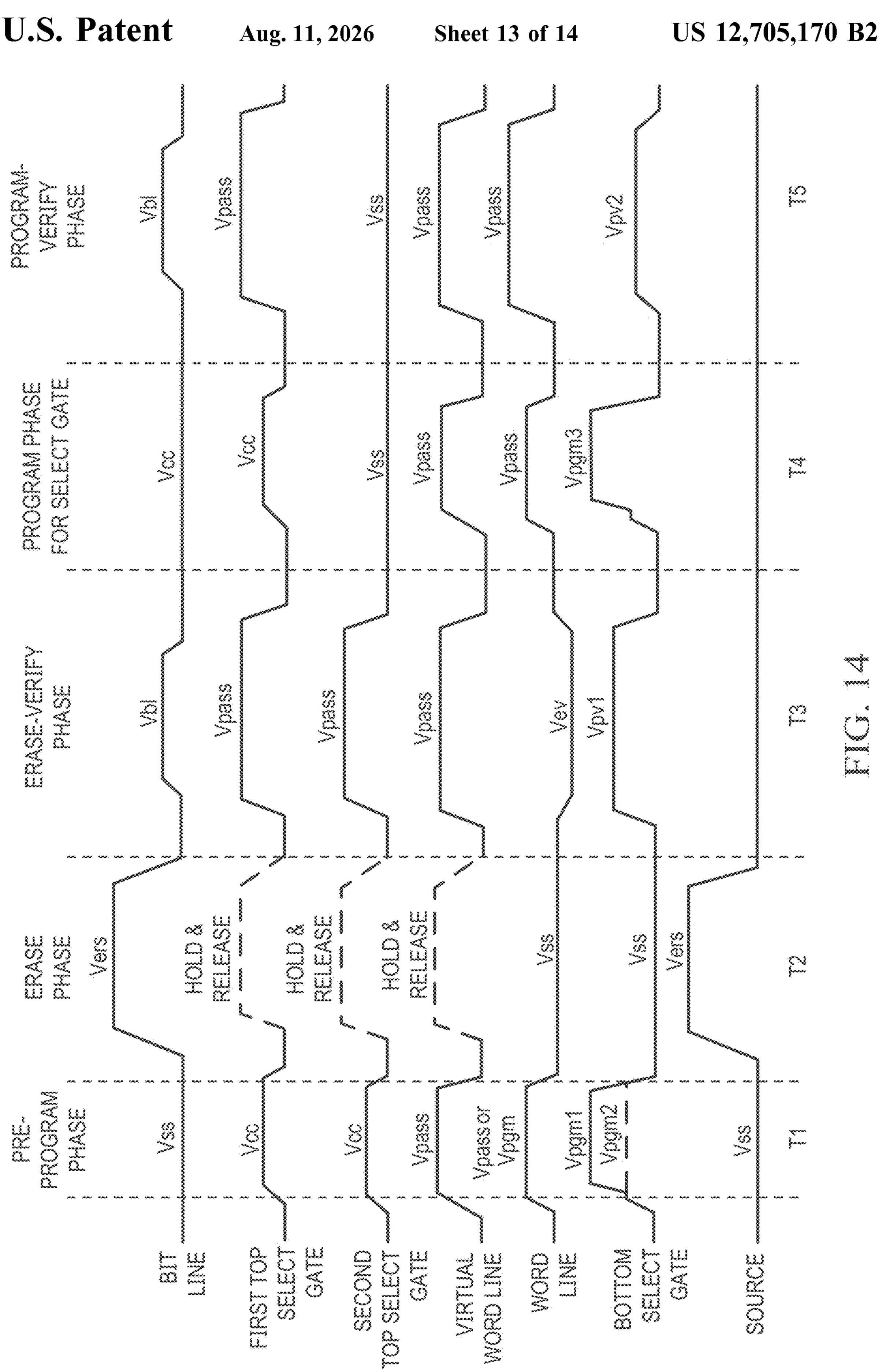
FIG. 14 is a schematic diagram of another possible voltage waveform for erasing a memory provided by an example of the present disclosure.

In examples of the present disclosure, referring to FIG. 14, because the threshold voltage of the select gate is to be adjusted, an erase cycle includes not only the erase phase and the erase-verify phase for the memory cell, but also at least the program phase for select gate, program-verify phase for select gate and pre-program phase. Therefore, compared with the example in which electrical separation is not adopted, certain time is added to the erase cycle included in this example of the present disclosure. In some examples, to shorten the erase cycle, the erase processes of the memory cell and the select gate may be integrated.

For example, during the process of erasing the memory cell, the target select gate is to be erased simultaneously. Because the effect of the electrical separation is achieved through the bottom select gate, the threshold voltage of the bottom select gate may drift, e.g., the threshold voltage of the bottom select gate is to be readjusted. The target select gate refers to the bottom select gate which is selected to be performed erase and program operations.

For example, continuing referring to FIG. 14, during the erase phase in an erase cycle, e.g., during the T2 time period, the control logic circuit 420 controls the row decoder 430 to apply the erase voltage Vss generated by the voltage generator 440 to the word line, while controlling the row decoder 430 to apply the erase voltage Vss generated by the voltage generator 440 to the ground select line GSL coupled to the target bottom select gate. The control logic circuit 420 further controls the row decoder 430 to apply the erase voltage Vers generated by the voltage generator 440 to the bit line. For example, during the program phase in a programming cycle, the row decoder 430 applies the same first erase voltage Vss to the word line and the ground select line GSL, and provides the second erase voltage Vers to the bit line. In some examples, the erase voltage applied to the word line and the ground select line is referred to as a first erase voltage, and the erase voltage applied to the bit line is referred to as a second erase voltage. While erasing the memory cells, the bottom select gate is erased. The second erase voltage Vers is at a high potential, and the first erase voltage Vss is at a low potential (0V), which enables a large potential difference to be formed between the channel potential and the gate potential of the memory page and the bottom select gate which are to be erased, so as to achieve erasing of the memory cell and the bottom select gate.

Operation S20: during the program phase for select gate, applying a pass voltage to the word line, and applying a program voltage to the select line coupled to the target select gate.

After finishing the erase operations on the memory cell and the bottom select gate, in order to ensure the use of the electrical separation function, the threshold voltage of the bottom select gate is to be programed to its corresponding target threshold voltage.

For example, continuing as shown in FIG. 14, during the program phase for select gate in an erase cycle, e.g., during the T4 time period, the control logic circuit 420 controls the row decoder 430 to apply the pass voltage Vpass generated by the voltage generator 440 to the word line while controlling the row decoder 430 to apply the program voltage Vpgm3 generated by the voltage generator 440 to the ground select line GSL coupled to the target bottom select gate. For example, during the program phase for select gate in a programming cycle, the row decoder 430 applies the erase voltage Vpass and the program voltage Vpgm3 to the word line and the ground select line GSL respectively, e.g., the bottom select gate is programmed to program the threshold voltage of the bottom select gate to its corresponding target threshold voltage.

An example of the present disclosure may simultaneously erase and program the select gate during the process of erasing the memory cell, thereby recalibrating the threshold voltage of the select gate which may bring a risk of failure. By resetting the state for the threshold voltage of the select gate, its potential failure problem may be eliminated, and the threshold voltage may be recalibrated to an expected range. Thus, the reliability and stability of the select gate are improved, and accordingly the realization of the electrical separation function may be ensured.

When the bottom select gates is being erased, if the threshold voltages of the bottom select gates are different, it will cause the bottom select gates to be inconsistent after being erased. Therefore, in order to ensure that the erased select gates have the same threshold voltage, e.g., to make the select gates have better consistency, a pre-program operation on is to be performed before the select gates are erased, so that all select gates have the same threshold voltage when an erase operation is performed on the select gates.

Figure 15:
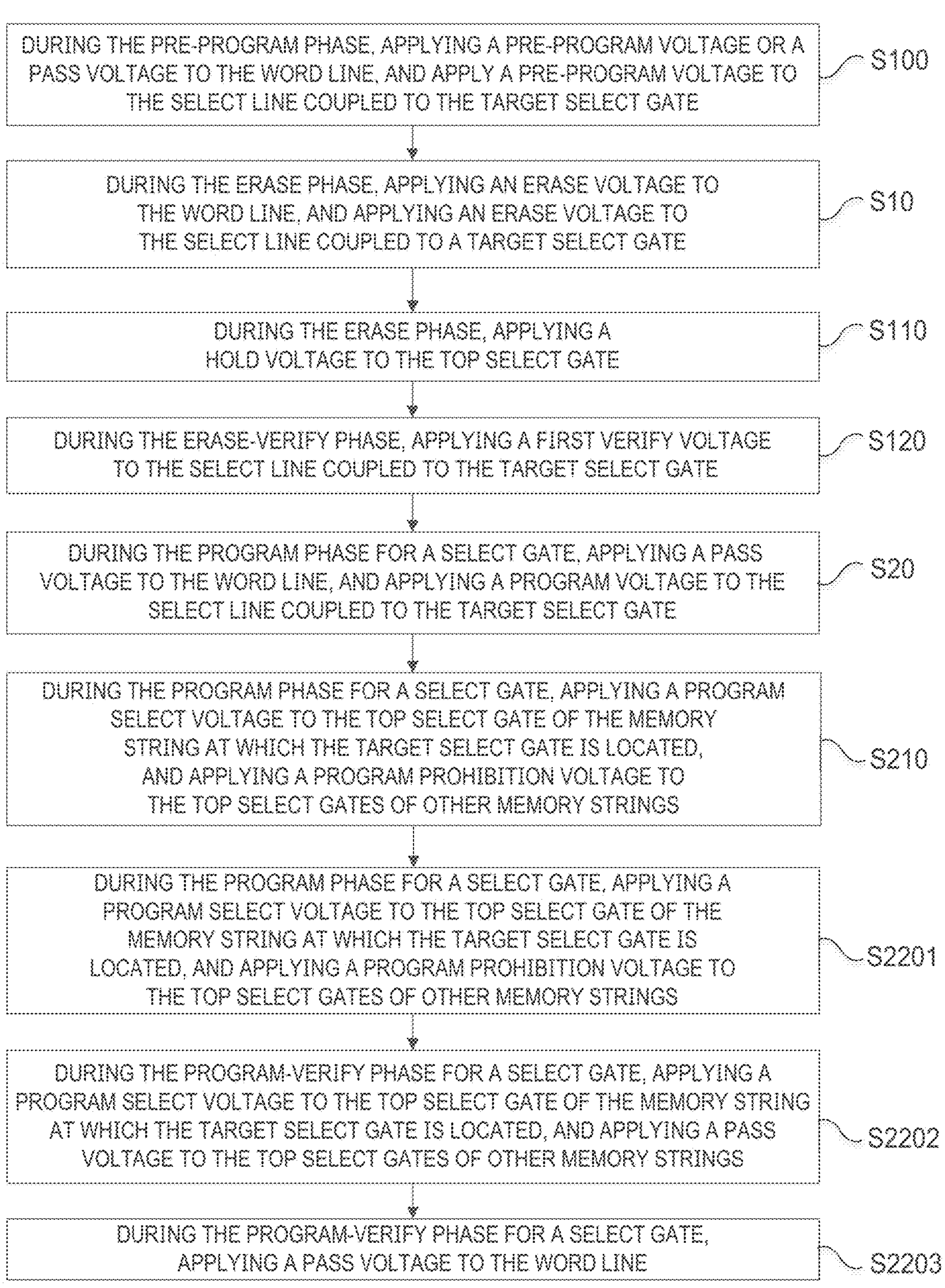
FIG. 15 is a schematic flowchart of another method for operating a memory provided by an example of the present disclosure.

In an example of the present disclosure, referring to FIG. 15, a pre-program phase is further included before the erase phase, and the method further includes:

Operation S100: during the pre-program phase, applying a pre-program voltage or a pass voltage to the word line, and apply a pre-program voltage to the select line coupled to the target select gate.

Through a pre-program operation, the potential of the channel may be raised through removing electrons from the channel. As an example, during the program phase in an erase cycle, e.g., during the T1 period, the row decoder 430 applies the pre-program voltage Vpgm1 and the pre-program voltage Vpgm2 to the select line coupled to the target select gate. It should be noted that the bottom select gate on the same select line includes two threshold voltages: Va and Vb. Thus, the pre-program voltage includes two types: Vpgm1 and Vpgm2, so that bottom select gates with different threshold voltages D may be programmed to the same threshold voltage to facilitate subsequent erase operations.

The memory cell will be verified after the erase operation is performed, but the select gate will not be verified. Because the select gate is also erased while the memory cell is erased, the select gate is to be verified, while the memory cell is to be verified. In a possible example, referring to FIG. 15, a method provided by an example of the present disclosure further includes:

Operation S110: During the erase phase, applying a hold & release voltage to the top select gate.

During the erase phase, because only the bottom select gate will be erased and programmed, the top select gate is not to be erased. Therefore, the voltage of the top select gate is to be in a hold & release state first, and then in a floating state, so that the potential of the top select gate is the same as the channel potential, thereby ensuring that the top select gate will not be erased while the bottom select gate and memory cell are erased.

As an example, during the erase phase in an erase cycle, e.g., during the T2 period, the control logic circuit 420 controls the row decoder 430 to apply the hold & release voltage (hold & release) generated by the voltage generator 440 to the top select gate, so that the top select gate will not be erased.

An example of the present disclosure further includes an erase-verify phase after the erase phase and before the program phase for select gate, and in the erase-verify phase, not only erase-verify of the memory cell is performed, but also erase-verify of the target select gate is performed. In a possible example, referring to FIG. 15, a method provided by an example of the present application further includes:

Operation S120: during the erase-verify phase, applying a first verify voltage to the select line coupled to the target select gate.

For a memory cell, through verifying the erase operation, in an aspect, it may be ensured that the data in the erased memory cell is completely erased and will no longer interfere with subsequent reading or programming. In another aspect, it may be ensured that the data in the memory cell is completely erased, thereby avoiding potential data residual problem. For the bottom select gate, through verifying the erase operation, it may ensure that all bottom select gates are in the same state after being erased, thereby making it more convenient to subsequently recalibrate the threshold voltage of the select gate to the expected range.

As an example, during the erase-verify phase, e.g., during the T5 period, when the row decoder 430 applies the erase voltage Vpass to the word line, it also applies the first verify voltage Vpv1 to the ground select line GSL. For example, during the program phase in a programming cycle, the row decoder 430 applies the erase voltage Vpass and the first verify voltage Vpv1 to the word line and the ground select line GSL respectively, e.g., the erase state of the bottom select gate and the erase state of the memory cell are verified simultaneously.

During the process of reprogramming the bottom select gates, in order to program the different bottom select gates to their corresponding target threshold voltages, different voltages are to be applied to different top select gates.

In a possible example, referring to FIG. 15, a method provided by an example of the present disclosure further includes:

Operation S210: during the program phase for select gate, applying a program select voltage to the top select gate of the memory string at which the target select gate is located, and applying a program prohibition voltage to the top select gates of other memory strings.

As an example, during the program phase for select gate in an erase cycle, e.g., in the T4 time period, the process of programming the bottom select gate G1Str1 will be described. The bottom select gate G1Str1 is the target select gate. When the row decoder 430 applies the program select voltage Vcc to the top select gate on the memory string Str1, the row decoder 430 also applies the program prohibition voltage Vss to the top select gate on the memory string Str2. Similarly, when the bottom select gate G1Str2 is being programmed, the bottom select gate G1Str2 is the target select gate. When the row decoder 430 applies the program select voltage Vcc to the top select gate on the memory string Str2, the row decoder 430 also applies the program prohibition voltage Vss to the top select gate on the memory string Str1.

After finishing the program operations of all bottom select gates, in order to ensure that the threshold voltages of all bottom select gates reach the target threshold voltage, program-verify operations are to be performed on all bottom select gates, and corresponding processing strategies are to be performed according to the verification results.

In a possible example, referring to FIG. 15, a program-verify phase for select gate is also included after the program phase for select gate, a method provided by an example of the present disclosure further includes:

Operation S2201: during the program phase for select gate, applying a program select voltage to the top select gate of the memory string at which the target select gate is located, and applying a program prohibition voltage to the top select gates of other memory strings.

In the example of the present disclosure, referring to FIG. 13, first, it is verified whether the threshold voltage of the target bottom select gate reaches a predetermined value at the current program voltage. If the predetermined value has been reached, the threshold voltage distribution of the bottom select gate meets the requirement, and the programming of the bottom select gate ends. If the threshold voltage of the bottom select gate does not reach the predetermined value, the next program voltage is used for programming, and the above operations are repeated until the threshold voltage of the target bottom select gate reaches the target threshold voltage.

As an example, during the program-verify phase for select gate in an erase cycle, e.g., during the T5 period, the control logic circuit 420 controls the row decoder 430 to apply the second verify voltage Vpv2 generated by the voltage generator 440 to the ground select line coupled to the bottom select gate, then determines whether the threshold voltage of the target bottom select gate reaches a predetermined value. If the threshold voltage of the target bottom select gate reaches the predetermined value, the process ends. If the threshold voltage of the target bottom select gate does not reach the predetermined value, the control logic circuit 420 controls the row decoder 430 to apply the program voltage Vpgm4 generated by the voltage generator 440 to the ground select line coupled to the bottom select gate. Then, the control logic circuit 420 controls the row decoder 430 to apply the second verify voltage Vpv2 generated by the voltage generator 440 to the ground select line coupled to the bottom select gate, and continues to perform the above determination operation until the threshold voltage of the bottom select gate reaches target threshold voltage. The program voltage Vpgm4 has a certain increment based on the program voltage Vpgm3.

In the process of programming the select gate, in order to ensure that only the memory string at which the target bottom select gate is located will be programmed and verified, thereby avoiding other memory strings from being mis-operated, different voltage operations are to be performed on the top select gates of different memory strings.

In a possible example, referring to FIG. 15, a method provided by an example of the present disclosure further includes:

Operation S2202: during the program-verify phase for select gate, applying a program select voltage to the top select gate of the memory string at which the target select gate is located, and applying a pass voltage to the top select gates of other memory strings.

Applying the program select voltage to the top select gate of the memory string at which the target select gate is located is to turn on the top select gate of the target memory string, thereby to select the target select gate to perform the program-verify operation. The pass voltage is applied to the top select gates of other memory strings at which non-target select gates are located, such that the non-target select gates are not turned on, thereby non-target select gates are avoided to be selected to be performed the program-verify operation.

As an example, during the program-verify phase for select gate in an erase cycle, e.g., in the T5 time period, the process of performing a program-verify operation on the bottom select gate G1Str1 will be described. The bottom select gate G1Str1 is the target select gate. When the row decoder 430 applies the program select voltage Vpass to the top select gate (the first top select gate) on the memory string Str1, the row decoder 430 also applies the program prohibition voltage Vss to the top select gate (the second top select gate) on the memory string Str2. Similarly, when the bottom select gate G1Str2 is being programmed, the bottom select gate G1Str2 is the target select gate. When the row decoder 430 applies the program select voltage Vpass to the top select gate on the memory string Str2, the row decoder 430 also applies the program prohibition voltage Vss to the top select gate on the memory string Str1.

In a possible example, referring to FIG. 15, a method provided by an example of the present disclosure further includes:

Operation S2203: during the program-verify phase for select gate, applying a pass voltage to the word line.

During the program-verify phase for select gate, since no corresponding operations will be performed on the memory cells, thus a pass voltage is applied to the word line to turn on the memory cells that are not selected for programming.

As an example, during the program-verify phase for select gate in an erase cycle, e.g., during the T5 period, the control logic circuit 420 controls the row decoder 430 to apply the pass voltage Vpass generated by the voltage generator 440 to the word line, so that no operations will be performed on the memory cells.

The memory operation method provided by the present disclosure simultaneously erases and programs the select gate during the process of erasing the memory cell, thereby recalibrating the threshold voltage of the select gate which may bring a risk of failure. The risk of failure refers to the drift of the threshold voltage of the select gate. By resetting the state of the select gate, its potential failure problem is eliminated, and the threshold voltage is recalibrated to the expected range, and the reliability and stability of the select gate are improved. Thereby, the normal realization of the electrical separation function is ensured.

An example of the present disclosure also provides a memory, e.g., the memory may comprise a memory shown in FIG. 9. The memory includes a peripheral circuit, and the peripheral circuit is configured to: during the erase phase, apply an erase voltage to the word line, and apply an erase voltage to the select line coupled to a target select gate, and during the program phase for select gate, apply a pass voltage to the word line, and apply a program voltage to the select line coupled to the target select gate.

In some examples, an erase-verify phase is further included after the erase phase and before the program phase for select gate, and the peripheral circuit is further configured to: during the erase-verify phase, apply a first verify voltage to the select line coupled to the target select gate.

In some examples, the select gate includes a top select gate and a bottom select gate, and the target select gate is a bottom select gate, and the peripheral circuit is further configured to: during the program phase for select gate, apply a program select voltage to the top select gate of the memory string at which the target select gate is located, and apply a program prohibition voltage to the top select gates of other memory strings.

In some examples, a program-verify phase for select gate is further included after the program phase for select gate, and the peripheral circuit is further configured to: during the program-verify phase for select gate, apply a second verify voltage to the select line coupled to the target select gate, and increase the program voltage in the case that the threshold voltage of the target select gate does not reach the target threshold voltage.

In some examples, the select gate further includes a top select gate, and the peripheral circuit is further configured to: during the program-verify phase for select gate, apply a program select voltage to the top select gate of the memory string at which the target select gate is located, and apply a pass voltage to the top select gates of other memory strings.

In some examples, the peripheral circuit is further configured to: during the program-verify phase for select gate, apply a pass voltage to the word line.

In some examples, the peripheral circuit is further configured to: during the erase phase, apply a hold & release voltage to the top select gate.

In some examples, a pre-program phase is further included before the erase phase, and the peripheral circuit is further configured to: during the pre-program phase, apply a pre-program voltage or a pass voltage to the word line, and apply a pre-program voltage to the select line coupled to the target select gate.

An example of the present disclosure also provides a memory system, e.g., the memory system includes a memory as described in the previous example and a memory controller, and the memory is coupled to the memory controller. For example, the memory system may include a memory system shown in FIG. 2 or FIG. 3.

An example of the present disclosure also provides an electronic device, the electronic device includes a host and a foregoing memory system, the host is connected to the memory system for storing data into the memory system or reading data from the memory system. In some examples, the electronic device may include an electronic device shown in FIG. 1 in the foregoing example.

Those skilled in the art may clearly understand that, for the convenience and simplicity of description, in the examples described above, each example has its own emphasis in description, and for a part that are not described in detail in a certain example, reference may be made to the corresponding process in a foregoing method example, which will not be repeated here.

In the several examples provided by this disclosure, the programming methods and memories provided may be implemented in other ways. For example, the division of a certain module is only a logical function division, and in actual implementation, there may be other division methods, such as a plurality of elements or components may be combined, or may be integrated into another system, or some features may be ignored, or not implemented.

Those of ordinary skill in the art may realize that the modules and algorithm operations of each example described in conjunction with the examples disclosed herein may be implemented with electronic hardware, or a combination of computer software and electronic hardware.

Whether these functions are performed in hardware or software depends on the specific application and design constraints of the technical solution. Those of ordinary skill in the art may implement the described functionality by using different methods for each specific application, but such implementations should not be considered to be beyond the scope of this disclosure.

The above is only specific implementations of the present disclosure, but the claimed scope of the present disclosure is not limited thereto, and changes or substitutions within the technical scope disclosed in the present disclosure that may be easily conceived by those skilled in the art shall fall within the claimed scope of the present disclosure. Therefore, the claimed scope of the present disclosure should be determined by the claimed scope of the claims.

What is claimed is:

1. A method for operating a memory, wherein the memory includes a plurality of memory strings, a memory string includes a plurality of memory cells and plurality of select gates, a memory cell is coupled to a word line and a bit line, and a select gate is coupled to a select line, the method including:

during an erase phase:

applying an erase voltage to the word line;

applying the erase voltage to the select line coupled to a target select gate from the plurality of select gates; and driving the bit line with a non-zero second erase voltage; and during a program phase for select gate, applying a pass voltage to the word line, and applying a program voltage to the select line coupled to the target select gate.

2. The method of claim 1, wherein an erase-verify phase is further included after the erase phase and before the program phase for select gate, and the method further includes:

during the erase-verify phase, applying a first verify voltage to the select line coupled to the target select gate.

3. The method of claim 2, wherein the select gate includes a top select gate and a bottom select gate, and the target select gate is the bottom select gate, and the method further includes:

during the program phase for select gate, applying a program select voltage to the top select gate of the memory string at which the target select gate is located, and applying a program prohibition voltage to the top select gates of other memory strings.

4. The method of claim 3, wherein a program-verify phase for select gate is further included after the program phase for select gate, and the method further includes:

during the program-verify phase for select gate, applying a second verify voltage to the select line coupled to the target select gate; and increasing the program voltage in response to a threshold voltage of the target select gate not reaching a target threshold voltage.

5. The method of claim 4, further including:

during the program-verify phase for select gate, applying a program select voltage to the top select gate of the memory string at which the target select gate is located, and applying a pass voltage to the top select gates of other memory strings.

6. The method of claim 4, further including:

during the program-verify phase for select gate, applying the pass voltage to the word line.

7. The method of claim 4, further including:

during the erase phase, applying a hold & release voltage to the top select gate.

8. The method of claim 1, wherein a pre-program phase is further included before the erase phase, and the method further includes:

during the pre-program phase, applying a pre-program voltage or the pass voltage to the word line, and applying the pre-program voltage to the select line coupled to the target select gate.

9. The method of claim 1, wherein the second erase voltage is greater in value than the erase voltage.

10. A memory, comprising:

an array of memory cells; and a peripheral circuit coupled to the array of memory cells, and is configured to:

during an erase phase:

apply an erase voltage to a word line;

apply the erase voltage to a select line coupled to a target select gate from a plurality of select gates; and drive a bit line with a non-zero second erase voltage; and during a program phase for select gate, apply a pass voltage to the word line, and apply a program voltage to the select line coupled to the target select gate.

11. The memory of claim 10, wherein an erase-verify phase is further included after the erase phase and before the program phase for select gate, and the peripheral circuit is further configured to:

during the erase-verify phase, apply a first verify voltage to the select line coupled to the target select gate.

12. The memory of claim 11, wherein the select gate includes a top select gate and a bottom select gate, and the target select gate is the bottom select gate, and the peripheral circuit is further configured to:

during the program phase for select gate, apply a program select voltage to the top select gate of a memory string at which the target select gate is located, and apply a program prohibition voltage to the top select gates of other memory strings.

13. The memory of claim 12, wherein a program-verify phase for select gate is further included after the program phase for select gate, and the peripheral circuit is further configured to:

during the program-verify phase for select gate, apply a second verify voltage to the select line coupled to the target select gate; and increase the program voltage in response to a threshold voltage of the target select gate not reaching a target threshold voltage.

14. The memory of claim 13, wherein the select gate further includes a top select gate, and the peripheral circuit is further configured to:

during the program-verify phase for select gate, apply a program select voltage to the top select gate of the memory string at which the target select gate is located, and apply the pass voltage to the top select gates of other memory strings.

15. The memory of claim 13, wherein the peripheral circuit is further configured to:

during the program-verify phase for select gate, apply the pass voltage to the word line; and during the erase phase, apply a hold & release voltage to the top select gate.

16. The memory of claim 10, wherein a pre-program phase is further included before the erase phase, and the peripheral circuit is further configured to:

during the pre-program phase, apply a pre-program voltage or the pass voltage to the word line, and apply the pre-program voltage to the select line coupled to the target select gate.

17. A memory system, including:

a memory controller configured to control a memory to write data or to read data stored in the memory; and the memory, including:

an array of memory cells; and a peripheral circuit coupled to the array of memory cells, and configured to:

during an erase phase:

apply an erase voltage to a word line;

apply the erase voltage to a select line coupled to a target select gate from a plurality of select gates; and drive a bit line with a non-zero second erase voltage; and during a program phase for select gate, apply a pass voltage to the word line, and apply a program voltage to the select line coupled to the target select gate.

18. The memory system of claim 17, wherein an erase-verify phase is further included after the erase phase and before the program phase for select gate, and the peripheral circuit is further configured to:

during the erase-verify phase, apply a first verify voltage to the select line coupled to the target select gate.

19. The memory system of claim 18, wherein the select gate includes a top select gate and a bottom select gate, and the target select gate is the bottom select gate, and the peripheral circuit is further configured to:

during the program phase for select gate, apply a program select voltage to the top select gate of a memory string at which the target select gate is located, and apply a program prohibition voltage to the top select gates of other memory strings.

20. The memory system of claim 19, wherein a program-verify phase for select gate is further included after the program phase for select gate, and the peripheral circuit is further configured to:

during the program-verify phase for select gate, apply a second verify voltage to the select line coupled to the target select gate; and increase the program voltage in response to a threshold voltage of the target select gate not reaching a target threshold voltage.

* * * * *